United States Patent
Pham et al.

(10) Patent No.: US 10,041,700 B1
(45) Date of Patent: Aug. 7, 2018

(54) HELIOSTAT ARRAY LAYOUTS FOR MULTI-TOWER CENTRAL RECEIVER SOLAR POWER PLANTS

(71) Applicant: eSolar, Inc., Burbank, CA (US)

(72) Inventors: Quoc Pham, Los Angeles, CA (US); Christian Gregory, La Crescenta, CA (US); Michael Slack, South Pasadena, CA (US); Bill Gross, Pasadena, CA (US); Dan Reznik, New York, NY (US); Porter Arbogast, Pasadena, CA (US)

(73) Assignee: ESOLAR, INC., Burbank, CA (US)

( * ) Notice: Subject to any disclaimer, the term of this patent is extended or adjusted under 35 U.S.C. 154(b) by 1022 days.

(21) Appl. No.: 14/189,408

(22) Filed: Feb. 25, 2014

Related U.S. Application Data

(63) Continuation of application No. 12/324,734, filed on Nov. 26, 2008, now Pat. No. 8,656,907.

(60) Provisional application No. 61/004,377, filed on Nov. 26, 2007.

(51) Int. Cl.
| | |
|---|---|
| *F24J 2/10* | (2006.01) |
| *F24J 2/16* | (2006.01) |
| *F24J 2/52* | (2006.01) |
| *H01L 31/0525* | (2014.01) |

(52) U.S. Cl.
CPC ............... *F24J 2/16* (2013.01); *F24J 2/5233* (2013.01); *H01L 31/0525* (2013.01)

(58) Field of Classification Search
None
See application file for complete search history.

(56) References Cited

U.S. PATENT DOCUMENTS

| | | |
|---|---|---|
| 1,367,472 A | 2/1921 | Harvey |
| 3,924,604 A | 12/1975 | Anderson |
| 4,047,517 A | 9/1977 | Arnberg |
| 4,110,009 A | 8/1978 | Bunch |
| 4,110,010 A | 8/1978 | Hilton |
| 4,117,682 A | 10/1978 | Smith |
| 4,135,489 A | 1/1979 | Jarvinen |

(Continued)

FOREIGN PATENT DOCUMENTS

| | | |
|---|---|---|
| CN | 1630798 | 6/2005 |
| EP | 1 793 181 A1 | 6/2007 |

(Continued)

OTHER PUBLICATIONS

Mills et al.,"Multi Tower Solar Array (MTSA) with ganged heliostats,"Journal de Physique IV, 1999, (pp. 83-88).

(Continued)

*Primary Examiner* — Jason Lau
(74) *Attorney, Agent, or Firm* — Brooks Acordia IP Law, PC; Pejman Yedidsion

(57) ABSTRACT

A solar power plant includes central receiver modules arranged in a regular pattern. Each central receiver module includes a tower, a central receiver mounted on the tower, and a heliostat array bounded by a polygon. The heliostat array includes heliostats with mirrors for reflecting sunlight to the central receiver. The heliostats are grouped in linear rows and each of the rows is parallel to another row. The locations of the heliostats are staggered between adjacent rows. The power plant also includes a power block for aggregating power from the central receivers and power conduits for transferring power from the central receivers to the power block.

20 Claims, 17 Drawing Sheets

(56) References Cited

U.S. PATENT DOCUMENTS

| | | | |
|---|---|---|---|
| 4,172,443 | A | 10/1979 | Sommer |
| 4,365,618 | A | 12/1982 | Jones |
| 4,466,423 | A | 8/1984 | Dolan et al. |
| 4,832,002 | A | 5/1989 | Medina |
| 6,959,993 | B2 | 11/2005 | Gross et al. |
| 2004/0074490 | A1 | 4/2004 | Mills et al. |
| 2007/0023079 | A1 | 2/2007 | Mills et al. |
| 2009/0007901 | A1 | 1/2009 | Luconi et al. |
| 2009/0038608 | A1 | 2/2009 | Caldwell |
| 2010/0175738 | A1 | 7/2010 | Huss et al. |

FOREIGN PATENT DOCUMENTS

| | | |
|---|---|---|
| SU | 989265 A | 1/1983 |
| WO | WO 90/13147 | 11/1990 |
| WO | WO 02/070966 A1 | 9/2002 |
| WO | WO 2005/119133 A2 | 12/2005 |
| WO | WO 2007/034717 | 3/2007 |
| WO | WO 2007/041018 A3 | 4/2007 |
| WO | WO 2007/143594 A2 | 12/2007 |
| WO | WO 2008/092194 A1 | 8/2008 |
| WO | WO 2008/092195 A1 | 8/2008 |

OTHER PUBLICATIONS

Schramek et al.,"Potential of the Heliostat Field of a Multi Tower Solar Array," Technische Universitat Muchen, 2006, (2 pages).
Romero et al.,"Distributed Power from Solar Tower Systems: A Mius Approach," Solar Energy 2000, (pp. 294-264).
Final Office action for U.S. Appl. No. 12/324,734 dated Jul. 18, 2013.
Final Office action for U.S. Appl. No. 12/324,734 dated Jan. 9, 2012.
Non-Final Office action for U.S. Appl. No. 12/324,734 dated Jan. 23, 2013.
Siala & Elayeb, "Mathematical formulation of a graphical method for a no-blocking heliostat field layout," Jul. 19, 2000, Renewable Energy, 23 (2001),pp. 77-92.
Diego Martinez Plaza, "Plataform Solar de Almeria:The European Solar Thermal Test Centre," CERN Academics Training Programme 2005-2006, Mar. 28-31, 2006, Geneve.
Non-Final Office action for U.S. Appl. No. 12/324,734 dated Jun. 27, 2011.
Notice of Allowance for U.S. Appl. No. 12/324,734 dated Oct. 31, 2013.
Supplemental EP Search Report for EP Patent Application No. 08853993 dated Feb. 6, 2013.
Second Office action for Chinese Patent Application No. 200880125558.5, Office action dated Oct. 26, 2012 (8 pages).
English Translation of Second Office action for Chinese Patent Application No. 200880125558.5, Office action dated Oct. 26, 2012(12 pages).
Office action for Chinese Patent Application No. 200880125558.5, Office action dated Nov. 17, 2011 (5 pages).
English Translation of Second Office action for Chinese Patent Application No. 200880125558.5, Office action dated Nov. 17, 2011 (7 pages).
Derwent Publication of SU 989265A,"Solar Electric Power Station has Tower with Stationary Radiation Detector and Surrounding Heliostat Field Formed by Rows of Reflectors",1983.
Schramek, Multi tower solar array (MTSA) technology, Applied and Plasma Physics; 2002;(4 pages).
Mills et al,"Multi Tower Solar Array Project", School of Physics, University of Sydney, 2006 (6 pages).
Schramek et al.,"Heliostats for maximum ground coverage", Energy vol. 29, Issues 5-6, Apr.-May 2004, (pp. 701-713).
International Search Report and Written Opinion dated Jan. 26, 2009 for International application No. PCT/US2008/085049 (9 pages).

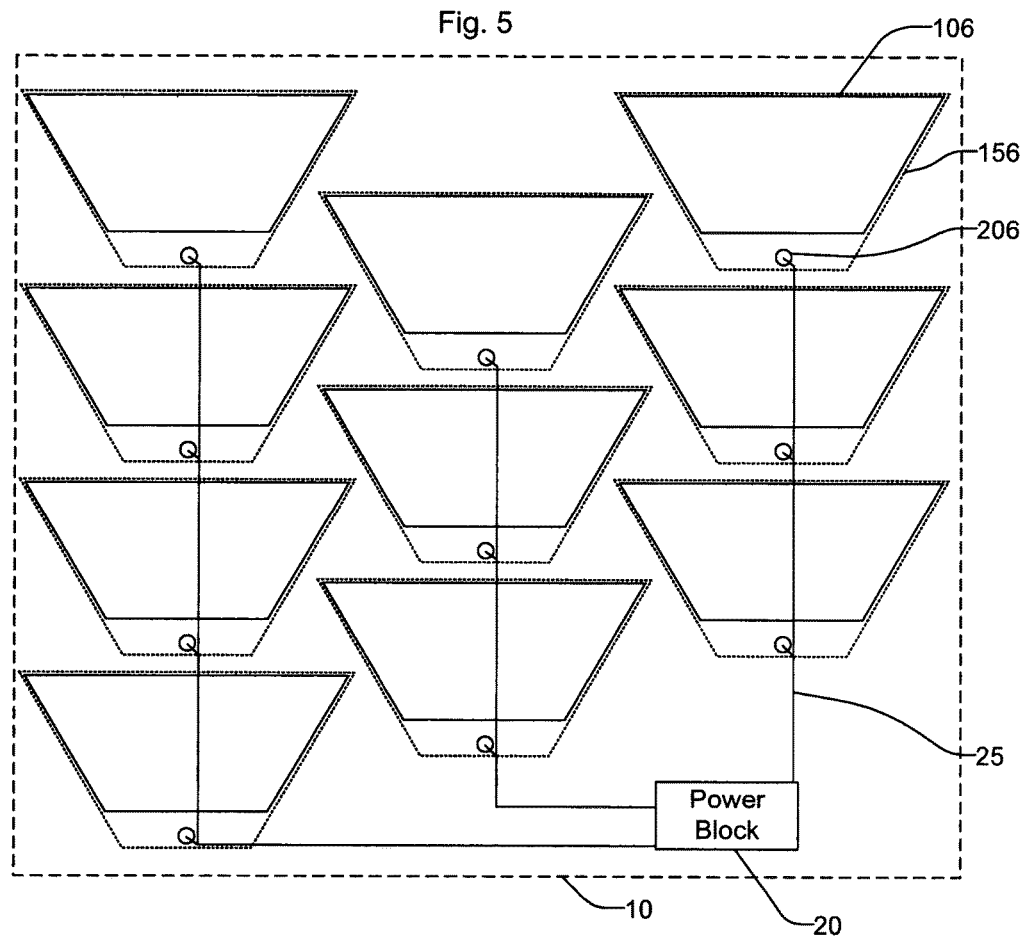

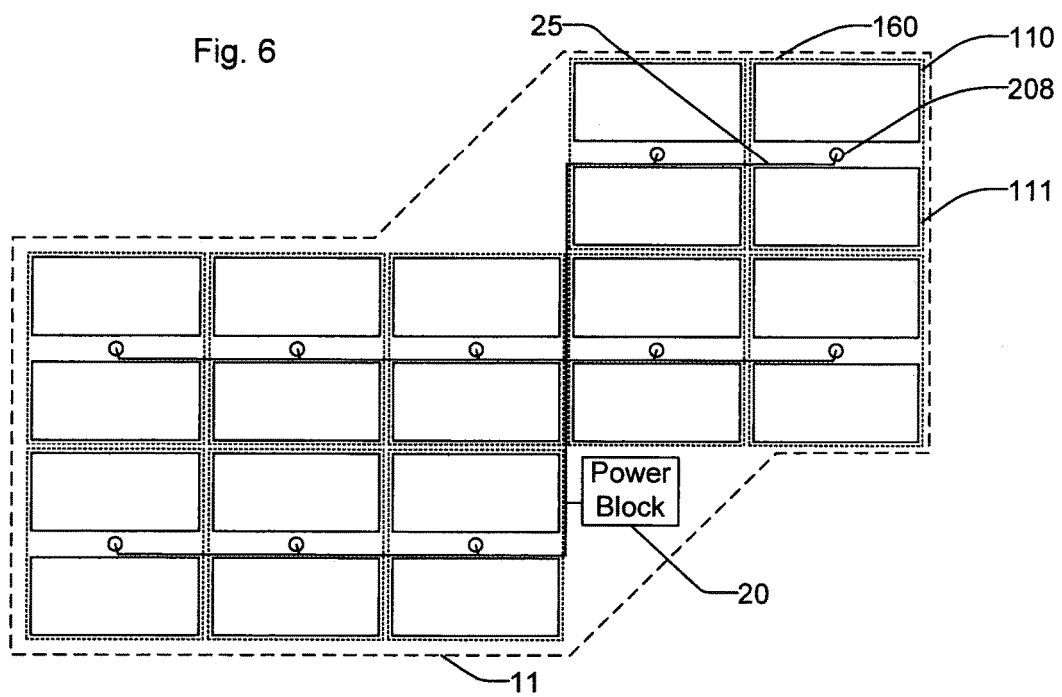
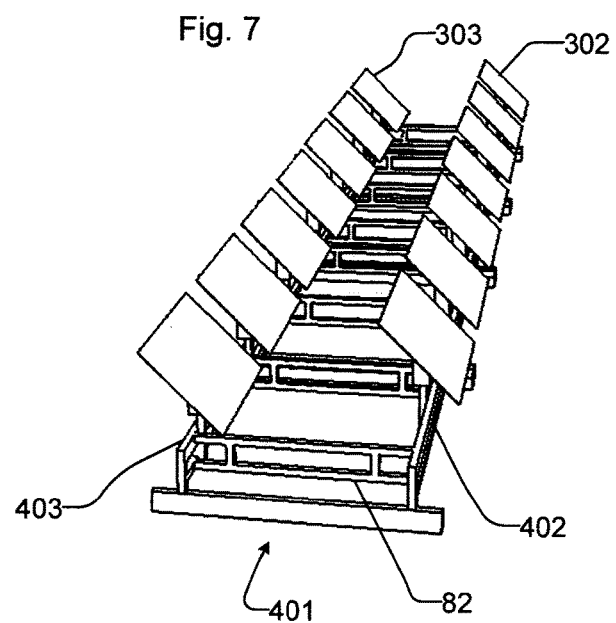

HELIOSTAT ARRAY LAYOUTS FOR MULTI-TOWER CENTRAL RECEIVER SOLAR POWER PLANTS

CROSS-REFERENCE TO RELATED APPLICATIONS

The present application is a continuation of U.S. Non-Provisional patent application Ser. No. 12/324,734, filed Nov. 26, 2008, which claims priority to and the benefit of U.S. Provisional Patent Application No. 61/004,377, filed on Nov. 26, 2007, the entire disclosures of which is are incorporated herein by reference.

BACKGROUND OF THE INVENTION

The present invention relates generally to a solar power plant, and more particularly to heliostat arrays in a central receiver solar power plant having multiple receivers.

Economic performance of a solar power plant improves when the energy in sunlight is collected and converted to a useable form with increasing efficiency. The economic performance of a solar power plant also improves when costs of manufacturing, installing, operating, and maintaining the elements of the plant decrease.

A central receiver solar power plant, also known as "power tower" architecture, has a tower-mounted receiver for collection of sunlight and conversion thereof into heat or electricity. Sunlight is concentrated on the receiver by reflection from heliostats spaced about the tower and located near ground level. Each heliostat has a mirror whose orientation is adjusted continuously to reflect sunlight toward the receiver. Efficiency of reflection of sunlight from a heliostat is affected by several phenomena, including the position of the heliostat relative to the tower and blocking and shading effects by adjacent heliostats. An arrangement of heliostats along tower-centered arcs, with progressively larger arc-to-arc distances and a staggered configuration of heliostats from arc to arc, has been the heliostat layout choice for central receiver plants, in both research and development and commercial settings, for example, as described in U.S. Pat. No. 4,365,618. In some plants, the heliostat array is bounded by a circular sector; in others, the sector spans a full 360 degrees around the tower.

However, economic performance of a solar power plant further depends on the cost of installing, maintaining, and operating the power plant, as well as the cost of the land occupied by the power plant, per unit of output power. Locating the heliostats of a central receiver power plant in the multiple arc manner leads to an installation process that is complex, difficult to survey, and irregular and costly in its installation. Additionally, parcels of land are generally available in rectangular areas. Thus a solar power plant with a circular (or circular sector) field of heliostats will not properly "nest" in a rectangular parcel of land, and thus yield a poorer land utilization for the entire plant. Accordingly, it is desirable to create a solar power plant that efficiently collects solar energy and is cost-effective to install.

SUMMARY OF THE INVENTION

Embodiments of the invention are directed toward efficient arrangements of heliostats in solar power plants.

An exemplary embodiment of the present invention provides a module for a solar power plant, including: a tower; a receiver mounted on the tower; and a heliostat array including a plurality of heliostats grouped in linear rows, each of the rows parallel to another of the rows, and locations of the heliostats along each of the rows staggered with respect to locations of the heliostats in adjacent rows, and wherein the heliostat array has a perimeter that is substantially polygonal and each heliostat includes a mirror for reflecting sunlight to the receiver.

A solar power plant, includes: an array of modules, each module including: a tower; a receiver attached to the tower; and a heliostat array including a plurality of heliostats grouped in linear rows, each of the rows parallel to another of the rows, and locations of the heliostats along each of the rows staggered with respect to locations of the heliostats in adjacent rows, and wherein the heliostat array has a perimeter that is substantially polygonal and each heliostat includes a mirror for reflecting sunlight to the receiver, and power conduits for transferring power from the receivers to a power block.

BRIEF DESCRIPTION OF THE DRAWINGS

These and other features and aspects according to exemplary embodiments of the present invention will become better understood in reference to the following description, appended claims, and accompanying drawings where:

FIG. 5 is a plan view of a multi-tower solar power plant according to another embodiment of the present invention;

FIG. 6 is a plan view of a multi-tower solar power plant according to another embodiment of the present invention;

FIG. 7 is a perspective view of linearly grouped heliostats according to aspects of the present invention;

DETAILED DESCRIPTION

Figure 1:
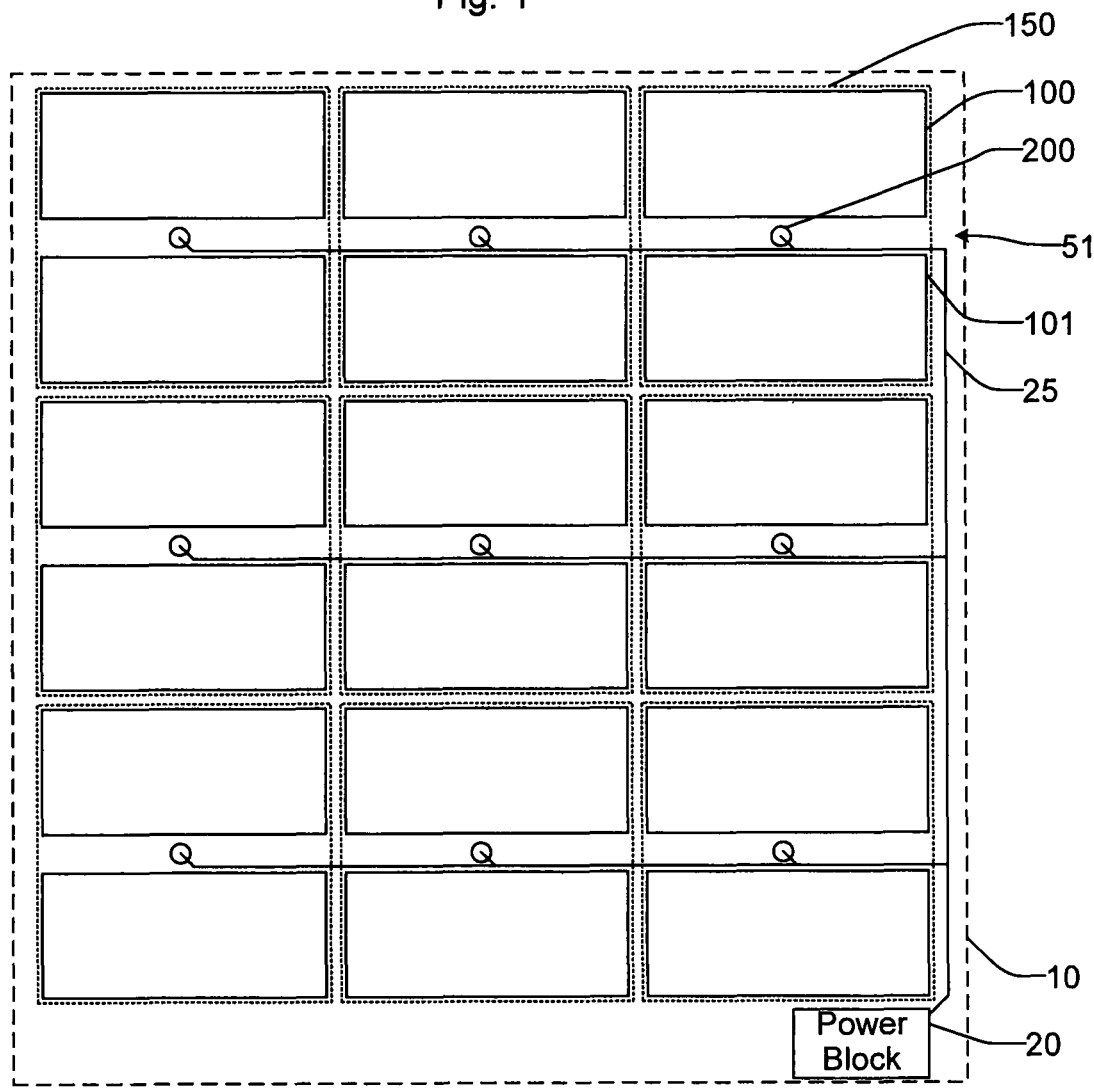
FIG. 1 is a plan view of a multi-tower solar power plant according to an embodiment of the present invention.

FIG. 1 is a plan view of a multi-tower solar power plant according to an embodiment of the present invention. The power plant includes an array of central receiver modules ("CRMs") 150. Each CRM 150 includes a tower-mounted receiver 200 that receives sunlight for direct steam or electricity production. Each receiver 200 is associated with a heliostat array (or field), which in this embodiment is split into a north heliostat array portion 100 and a south heliostat array portion 101 by east-west access ways. The north heliostat array portions 100 are located to the north of the corresponding receivers 200, and the south heliostat array portions 101 are located to the south of the corresponding receivers 200. Each heliostat array includes a large number of ground-mounted heliostats for reflecting sunlight to the receiver. Each heliostat has a mirror whose orientation is adjusted to continuously reflect the moving sun toward the stationary receiver. Heat collected by the receivers 200 is transferred by power conduits 25 to a power block 20. Heat flows in the power conduits 25 may merge along the paths to the power block 20, at the power block 20, or combination thereof. The combined output from receivers may then be used directly or converted to electricity by a turbine generator, for example, a steam-to-electricity turbine.

The north and south heliostat array portions 100, 101 have rectangular shapes and all of the arrays have essentially the same arrangement of heliostats. Unlike solar power plants with arc-shaped layouts, in the present invention, the heliostats are grouped in linear rows with adjacent rows parallel. To minimize blocking, heliostats are staggered (or half-stepped) relative to the heliostat locations in an adjacent row. Although specific arrangements of the heliostats will be described in more detail below, it should be noted now that regularity and polygonal boundaries of the heliostat arrays beneficially impacts manufacturing, installation, operating, and maintenance costs.

The power plant of the embodiment shown in FIG. 1 occupies a rectangular tract of land 10. Land parcels typically use an axis-aligned rectangular grid with baselines running east-west and meridians running north-south. In the United States, a quarter section, nominally one-half mile in each direction, is the typical unit of land available for purchase or lease by a power plant developer. From FIG. 1, it is apparent that the central receiver modules 150, having substantially rectangular outlines, and being located side-to-side and top-to-bottom, occupy nearly the entire rectangular (or square) tract of land 10 and thus efficiently utilize the available land area as available in practice.

The embodiment of FIG. 1 includes CRMs 150 arranged in three north-south columns and three east-west rows. Other embodiments may have different numbers of columns and rows, for example, four columns and three rows or four columns and four rows.

The power plant also includes tower access ways 51. The access ways 51 are paths via which people and equipment can erect the tower-receiver combination and during operation reach each of the towers 200 for maintenance and inspection purposes. The access ways 51 are breaks in the arrays of heliostats of sufficient width (e.g., within which a crane or truck can fit) and may have improved surfaces as required by local land conditions.

The power block 20 receives the aggregate power output from all receivers 200 and converts it for immediate use or storage. In the case of a solar-thermal plant, the output of several receivers allows for a more economical conversion into electricity by a single turbine. The output power is conveyed from the receivers 200 to the power block through power conduits 25. The power conduits 25 may be pipes conveying a heat-transfer fluid, such as oil, molten salt, or steam. In other embodiments, for which the receiver is a concentrated photovoltaic array, power may be conveyed to the power block by electrical cabling. In the embodiment of FIG. 1, the power conduits 25 are on the land surface and located in the access ways 51. In other embodiments, the power conduits 25 are subterranean and may be routed in nearly straight lines from the receivers 200 to the power block 20. In yet another embodiment, the power conduits may be routed skirting the exterior boundary of each heliostat array. In general, conduit routing is a compromise between losses (caused by excessive length) and engineering costs.

Figure 2:
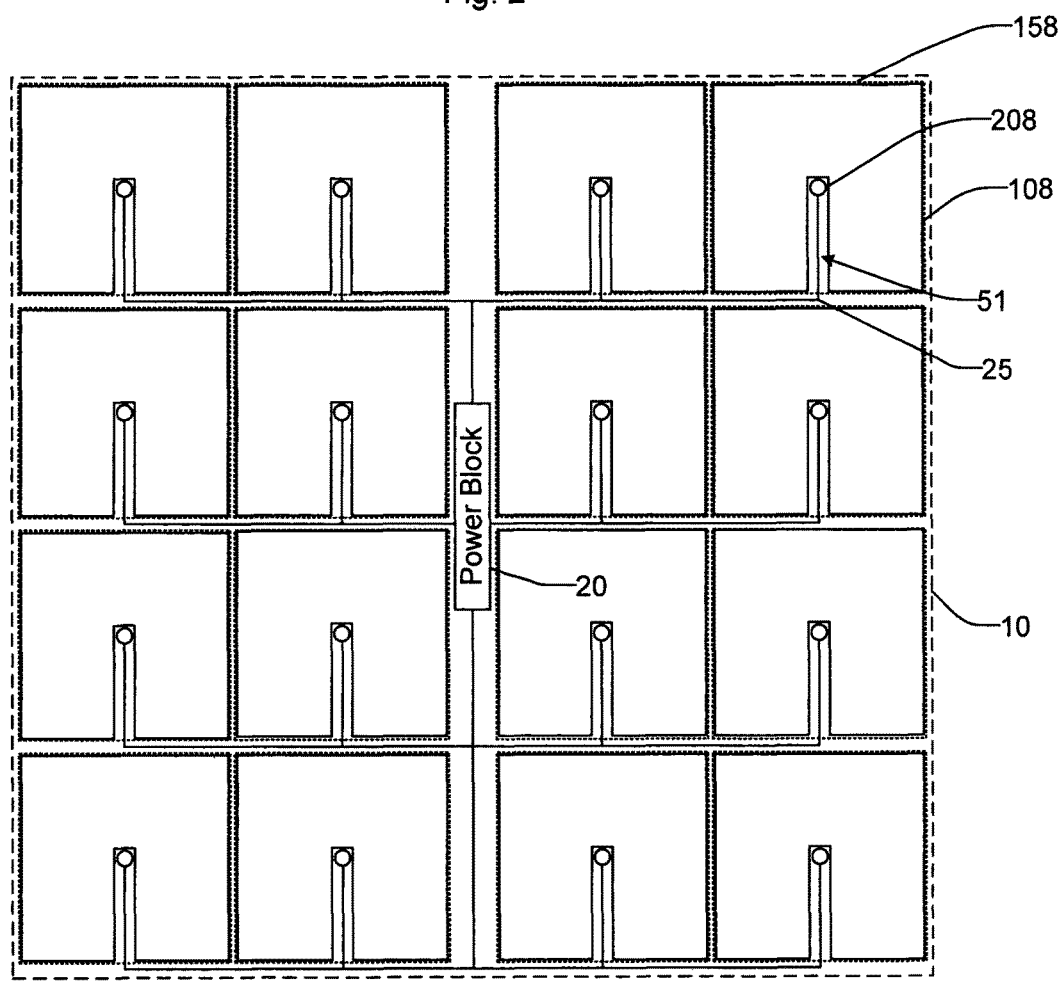
FIG. 2 is a plan view of a multi-tower solar power plant according to another embodiment of the present invention.

FIG. 2 is a plan view of a solar power plant according to another embodiment of the present invention. This embodiment differs from the embodiment of FIG. 1 in the pattern of CRMs, the shape of heliostat arrays, and power block location. CRMs 158 are arranged in four columns of four modules each. Each CRM 158 has a receiver 208 centrally located in a rectangular heliostat array 108. Each heliostat array 108 has an access lane 51 extending from the receiver 208 to the southern perimeter of the array. Thus, heliostats are located in a U-shaped area of the CRM. The power block 20 is located near the center of a land tract 10. Centrally locating the power block 20 reduces the length of the power conduits 25 that convey power from the receivers 208 to the power block 20 and thereby reduces conduit costs and power losses. In another embodiment, better suited for a southern hemisphere installation, the access lane extends from the receiver to the northern perimeter of the array.

Figure 3:
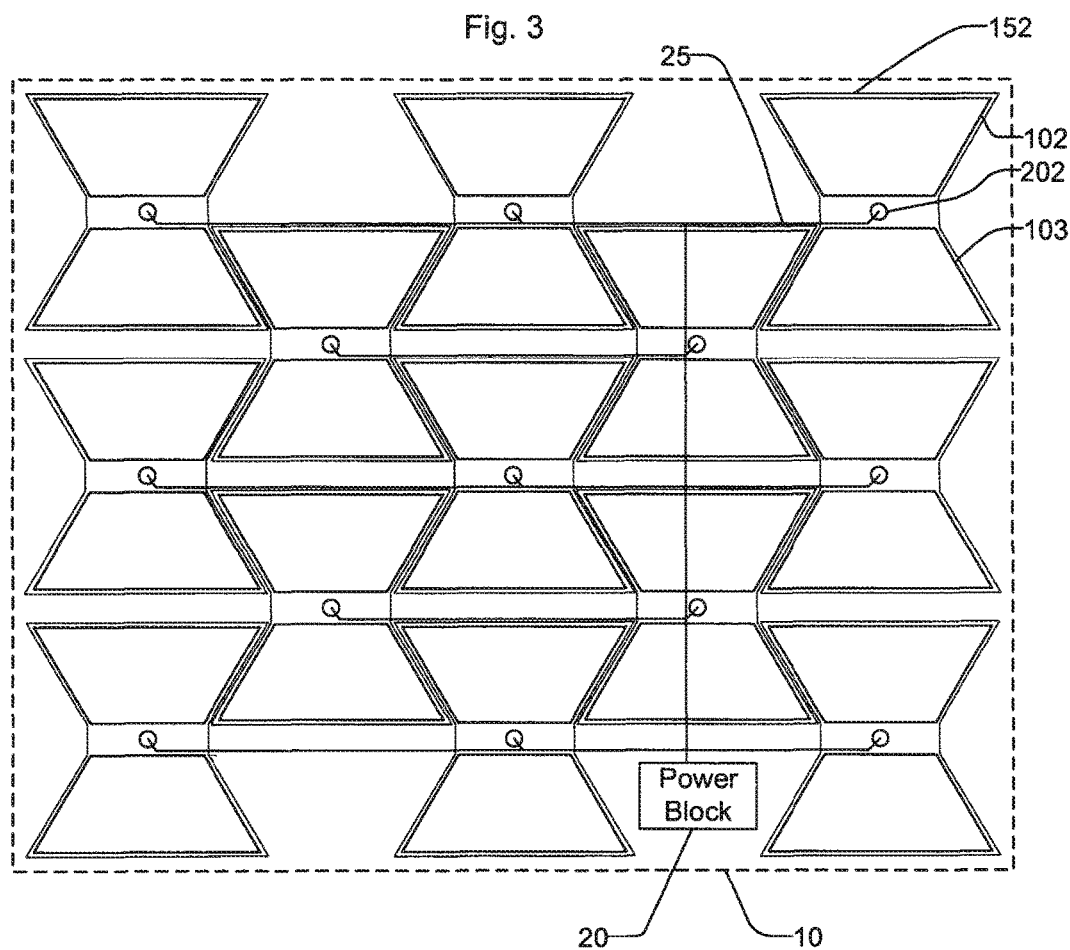
FIG. 3 is a plan view of a multi-tower solar power plant according to another embodiment of the present invention.

FIG. 3 is a plan view of a solar power plant according to another embodiment of the present invention. This embodiment differs from the embodiment of FIG. 1 in the pattern of CRMs and shape of heliostat arrays. Each CRM 152 has a receiver 202 centrally located between a trapezoidal north heliostat array 102 and trapezoidal south heliostat array 103. Although trapezoidal heliostat arrays cannot be tiled side-by-side to make efficient use of the land as the rectangular arrays of the embodiment of FIG. 1, in the embodiment of FIG. 3, the CRMs 152 are arranged in an interlocking regular pattern that is orderly and methodical and maximizes land utilization under the particular array boundary. The CRMs 152 are arranged in three major columns of three modules each. Equally spaced between each nearest four of these modules is an additional module. The heliostat arrays, in the embodiment of FIG. 3, have perimeters shaped as isosceles trapezoids with sixty-degree base angles. The north heliostat arrays 102 have their bases aligned east-west and to the north. The south heliostat arrays 103 also have their bases aligned east-west but to the south. In other embodiments, the trapezoids may have base angles differing from sixty degrees. In still other embodiments, the trapezoids may be non-isosceles.

Figure 4:
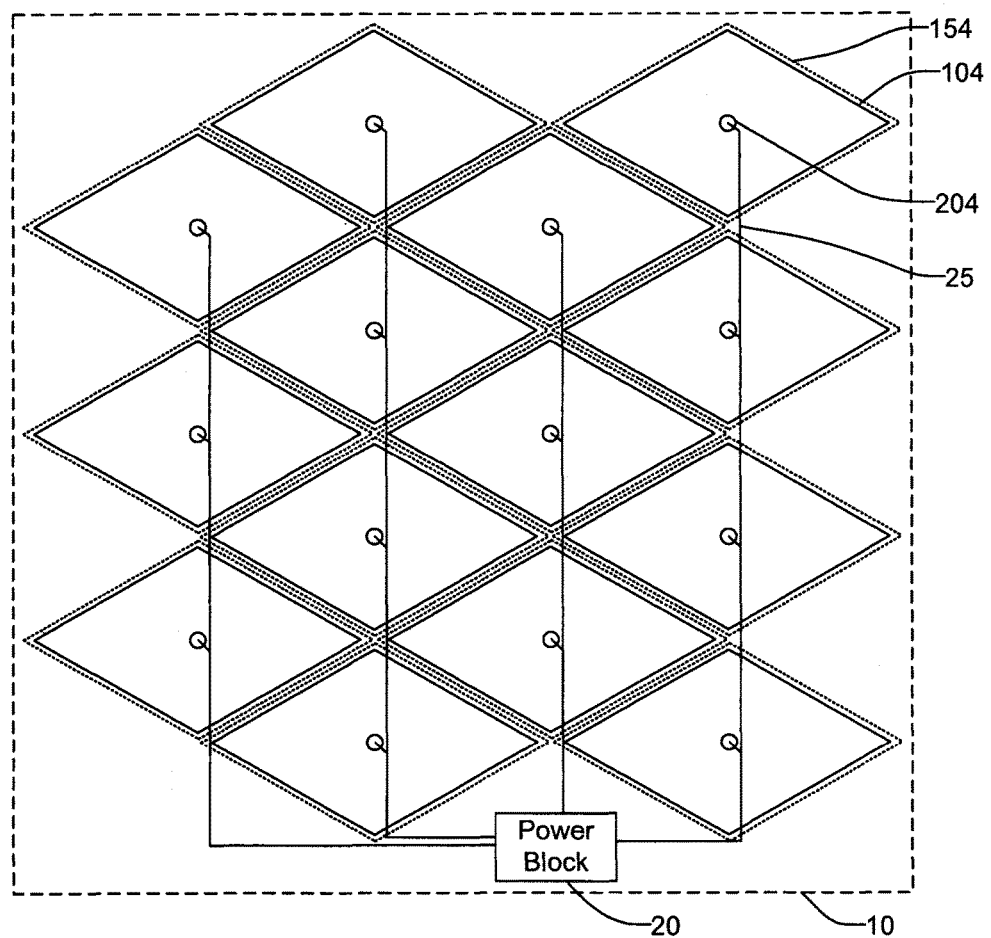
FIG. 4 is a plan view of a multi-tower solar power plant according to another embodiment of the present invention.

FIG. 4 is a plan view of a solar power plant according to another embodiment of the present invention. This embodiment differs from the embodiment of FIG. 1 in the pattern of CRMs and shape of heliostat arrays. Each CRM 154 has a receiver 204 centrally located in a heliostat array 104 shaped as a rhombus (or diamond). The CRMs 154 are efficiently packed with each receiver 204 equidistant from six nearest neighbors. The heliostats arrays of the embodiment of FIG. 4 are not divided into north and south portions, but, in an alternative embodiment, they may be so divided, e.g., by inclusion of tower access lanes. In other embodiments, the receivers may be located between a north rhombus-shaped heliostat array portion and a south rhombus-shaped heliostat array portion.

FIG. 5 is a plan view of a solar power plant according to another embodiment of the present invention. This embodiment differs from the embodiment of FIG. 1 in the pattern of CRMs and shape of heliostat arrays. Each CRM 156 has a receiver 206 and a heliostat array 106 located to the north of the receiver 206 (in a variant embodiment, the heliostat array is a mirror image of that shown, located south of the receiver). The CRMs 156 are arranged in side-by-side columns whose boundaries are tiled in interlocking fashion so as to increase land utilization. The heliostat arrays 106 have perimeters shaped as trapezoids. The heliostat arrays 106 have their bases aligned east-west and to the north. A north-field only embodiment may be advantageous for receivers with a single-sided aperture. In this embodiment, a power block 20 is located in the south-east corner of the power plant. The power block 20 is located where a heliostat array may have been located if the pattern of the other heliostat arrays had been continued. This arrangement may be adapted to the above embodiments as well and may be advantageous depending on the sizes and aspect ratios of the power block and heliostat arrays. Alternatively, the power block may be nested in a central area of the plant having sufficient clearance.

FIG. 6 is a plan view of a solar power plant according to another embodiment of the present invention. This embodiment differs from the embodiment of FIG. 1 in the pattern of CRMs and the land tract occupied by the power plant. The power plant occupies a tract of land 11 having an irregular polygonal shape. However, the CRMs 160 are arranged in a space-filling pattern. The pattern begins in the southwest corner of the tract of land 11 with the CRMs 160 arrayed to the east and north until the outer limits of the tract are reached. The modules are then offset to the north and the arraying continues until the outer limits of the tract are again reached. In other embodiments, the tract of land for the power plant may be differently shaped. In these embodiments, the CRMs are still arranged in a regular pattern that methodically arrays or tiles the heliostats and receivers across the available land. In yet another embodiment, the tract of land may have rectangular or polygonal boundaries, but with internal regions which are unusable, e.g., due to topography, the presence of bodies of water, or other obstructions. In such embodiments, the pattern of CRMs would still be tightly interlocked, while avoiding the unusable regions. In yet another embodiment, the tract of land may have an irregular boundary and CRMs may be laid out in a tight interlocking fashion, while cropping parts of their boundaries which fall outside the boundary of the tract of land.

FIG. 7 is a perspective view of a heliostat support system suitable for use with the present invention. The system is described in detail in U.S. patent application Ser. No. 12/136,001, filed Jun. 9, 2008, the entire disclosure of which is incorporated herein by reference. A row of heliostats 302 is mounted on a linear support member 402. A second row of heliostats 303 is mounted on another linear support member 403. The two rows are of heliostats are fixed apart by cross-members 82 between the two linear support members 402, 403. The mirrors in FIG. 7 are rectangular but the invention is not so limited.

Alternative exemplary embodiments of CRMs will now be described with reference to FIGS. 8-16. In each figure, the number of heliostats shown is limited to tens of heliostats for illustration purpose although a physical embodiment of the present invention may have thousands of heliostats.

Figure 8:
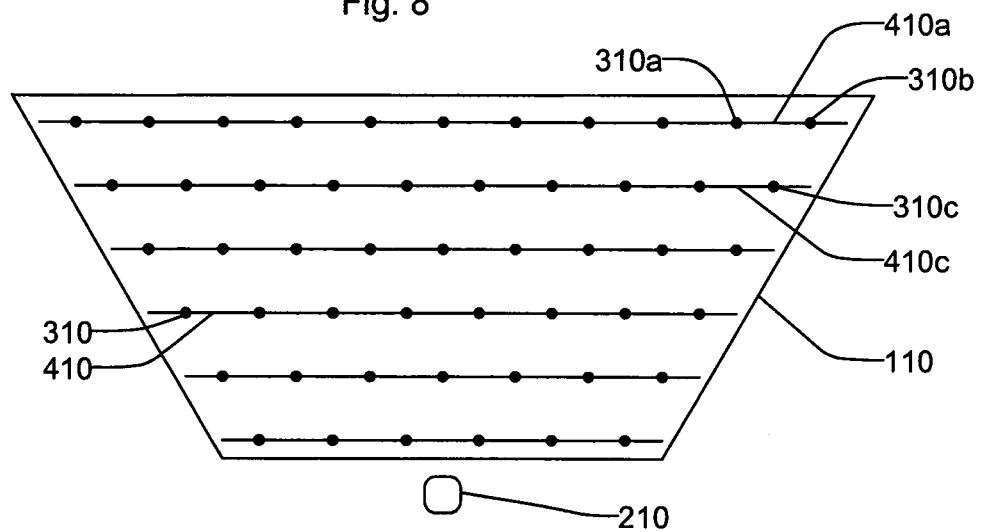
FIGS. 8-16 are plan views of heliostat arrays according to aspects of the present invention.

FIG. 8 is a plan view of an embodiment of a CRM suitable for use with a solar power plant, for example, the power plant embodiment of FIG. 3 or 5. The module includes a receiver 210 and a heliostat array to the north having a perimeter 110 shaped as a trapezoid. The heliostat array includes a regular array of heliostats 310. The heliostats are grouped in parallel linear rows 410 running east-west. Locations of the heliostats 310 along each of the rows 410 are staggered (half-stepped) from row-to-row. That is, for two adjacent heliostats 310a, 310b in a northernmost row 410a, an adjacent row 410c includes a heliostat 310c located midway between the heliostats 310a, 310b in the northernmost row 410a. When the center of two adjacent heliostats 310a, 310b in a northernmost row 410a and the center of a heliostat 310c in the adjacent row 410c form an isosceles triangle, the heliostat centers will be hexagonally packed. The heliostats may be mounted on a support structure as shown in FIG. 7.

Figure 9:
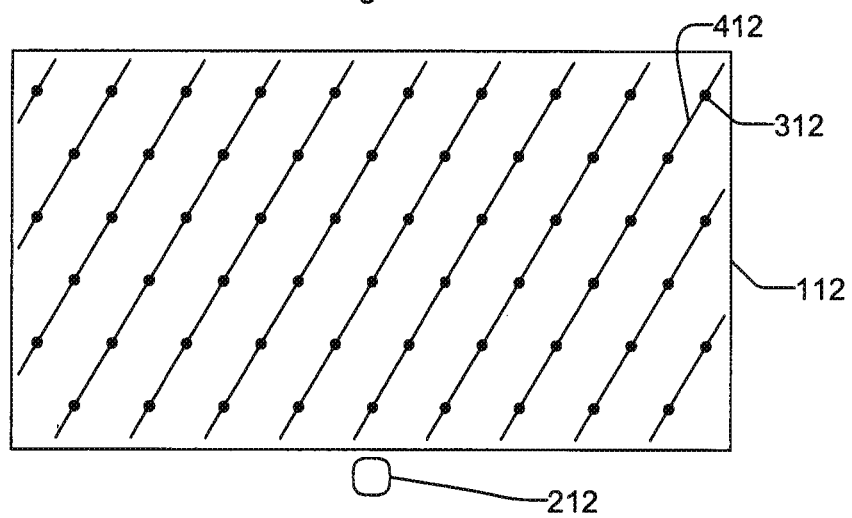

FIG. 9 is a plan view of an embodiment of a CRM suitable for use with a solar power plant, for example, the power plant embodiment of FIG. 1. The module includes a receiver 212 and a heliostat array to the north having a perimeter 112 shaped as a rectangle. The heliostat array includes a regular array of heliostats 312. The heliostats are grouped in parallel rows 412 running at a diagonal angle from east-west. The heliostats are staggered from row-to-row and the rows are spaced so that the heliostat centers are hexagonally packed. From FIGS. 8 and 9, it is apparent that heliostats may be placed in like locations with either of the orientations of the linear groups.

In the embodiment of FIG. 9 (and similarly in other example embodiments) the boundary of the heliostat array is illustrated as a rectangle. In most embodiments, there is no physical barrier or the like bounding the heliostat array. Instead, the perimeter 112, as illustrated in FIG. 9, conceptually bounds the array of heliostats. Additionally, the perimeters are described as simple polygons at a macroscopic level. This ignores minor irregularities that may exist in the heliostat array, for example, the perimeter may have ragged edges when considered at a heliostat-by-heliostat level.

Figure 10:
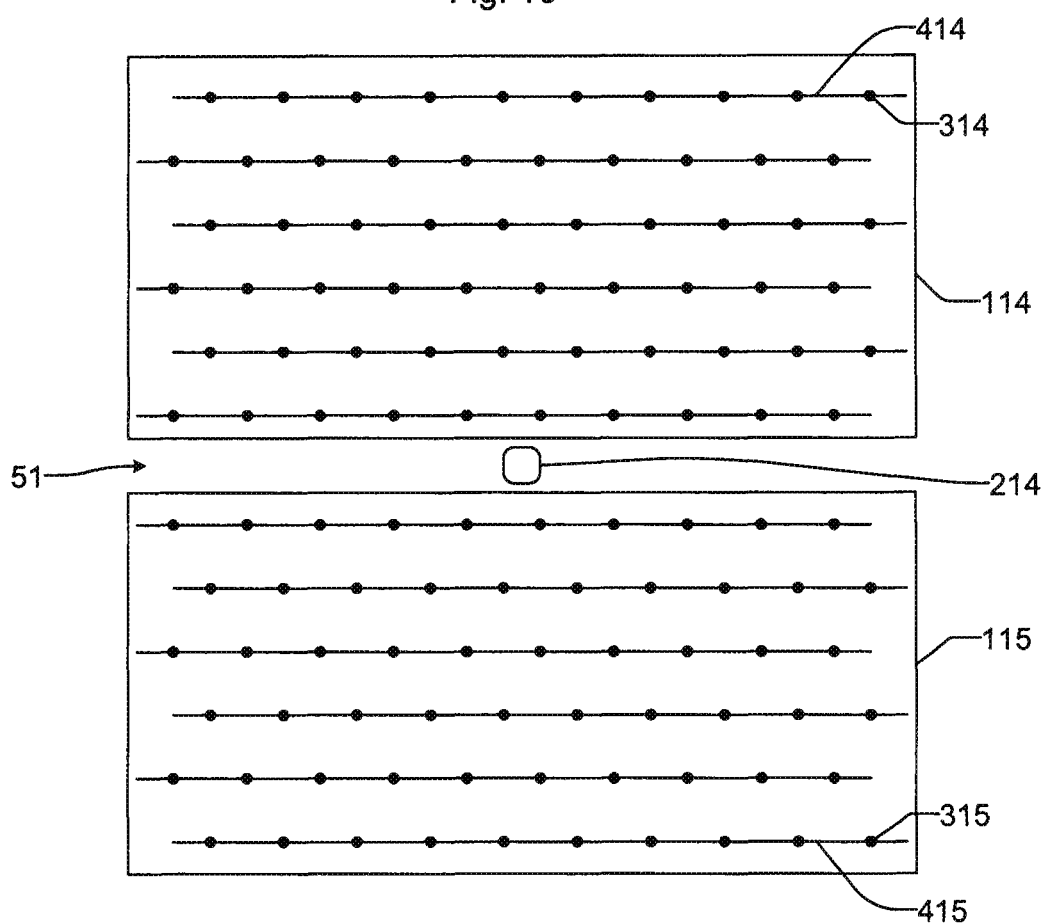

FIG. 10 is a plan view of an embodiment of a CRM suitable for use with a solar power plant, for example, the power plant embodiment of FIG. 1. The module includes a receiver 214 and a heliostat array split into a north portion with a rectangular perimeter 114 and a south portion also with a rectangular perimeter 115. Each portion is similar to the heliostat array of the embodiment of FIG. 9 except the rows of heliostats run east-west. The heliostat array includes a medially located access lane 51 providing access to the receiver tower 214.

Figure 11:
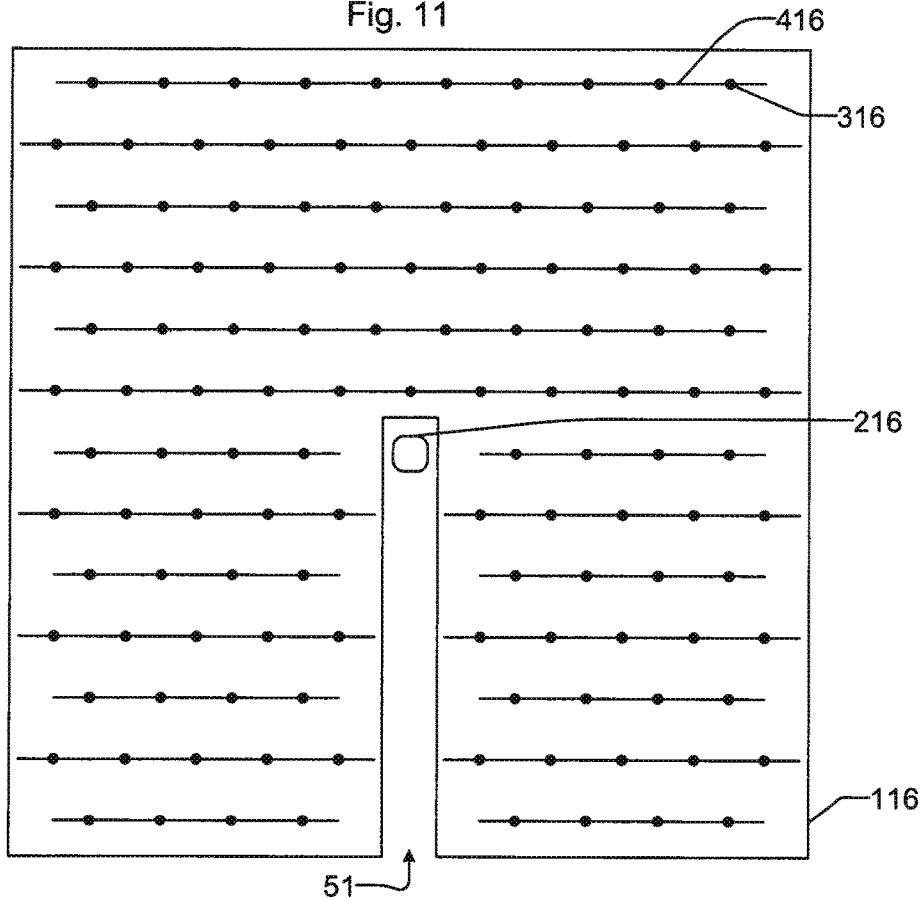

FIG. 11 is a plan view of an embodiment of a CRM suitable for use with a solar power plant, for example, the power plant embodiment of FIG. 2. The module includes a receiver 216 centrally located in a rectangular heliostat array. The heliostat array has perimeter 116 that is U-shaped. That is, it is a rectangle with an access lane 51 cutting from the southern edge to the receiver 216. In other embodiments, the access lane may be located to the north of the receiver; however, preserving heliostats to the north of the receiver are generally preferred in power plants located in the northern hemisphere. In yet other embodiments, the access lane may extend west-only (or east-only) of the receiver.

Figure 12:
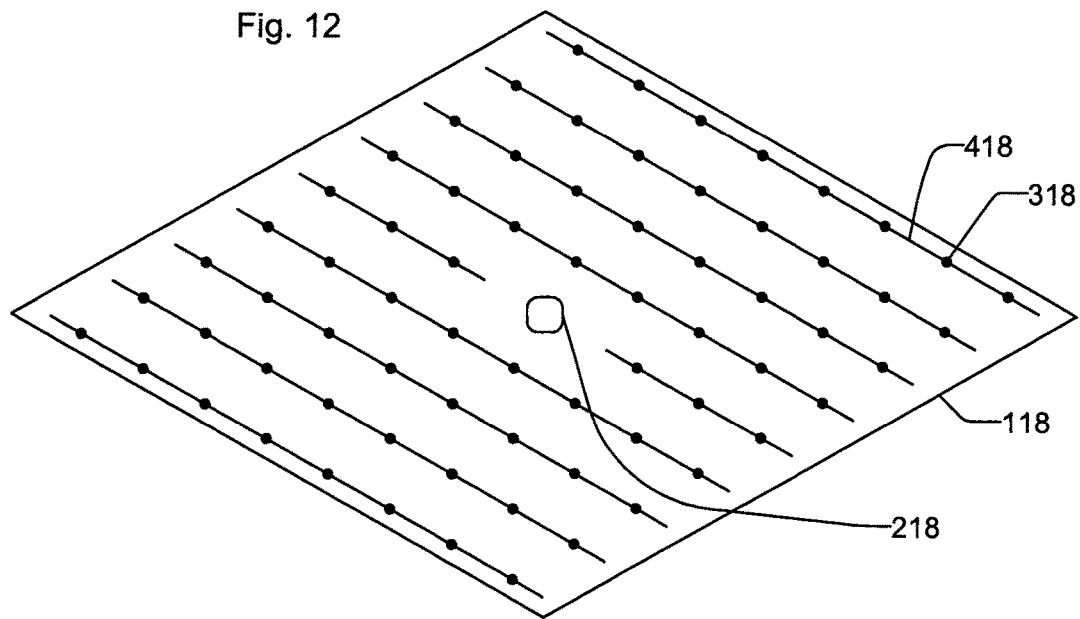

FIG. 12 is a plan view of an embodiment of a CRM suitable for use with a solar power plant, for example, the power plant embodiment of FIG. 4. The module includes a receiver 218 centrally located in a heliostat array having a rhombus (or diamond) shaped perimeter 118. The internal angles at the east and west vertices are equal. The heliostats 318 are grouped in linear rows 418 oriented parallel to edges of the perimeter 118.

Figure 13:
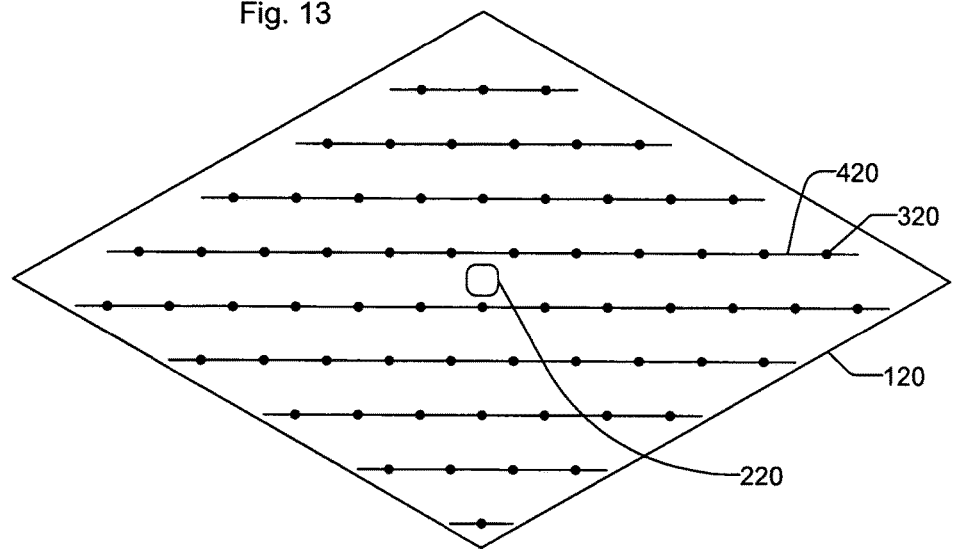

FIG. 13 is a plan view of another embodiment of a CRM suitable for use with a solar power plant, for example, the power plant embodiment of FIG. 4. The module includes a receiver 220 centrally located in a heliostat array having a rhombus shaped perimeter 120. This embodiment differs from the embodiment shown in FIG. 12 in that the heliostats 320 are grouped in linear rows 420 oriented in an east-west direction. In another embodiment, a module includes a receiver located to the south of a heliostat array having a rhombus shaped perimeter.

Figure 14:
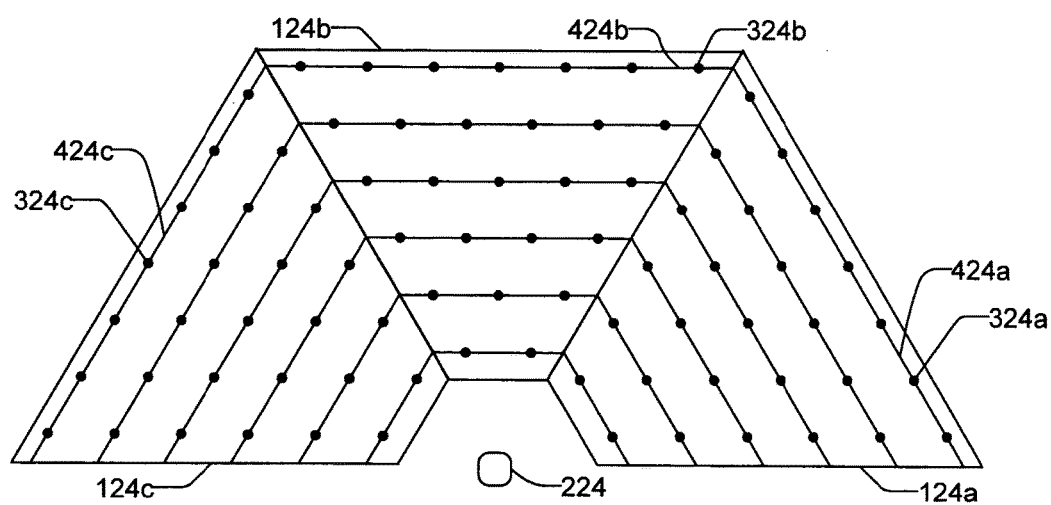

FIG. 14 is a plan view of an embodiment of a CRM according to aspects of the present invention. The module includes a receiver 224 and a segmented heliostat array to the north. A first polar segment (or sector) of the heliostat array has a perimeter 124a shaped as a trapezoid. The base of the trapezoid is oriented distant from the central tower 224. A second polar segment of the heliostat array has a perimeter 124b also shaped as a trapezoid. The second segment is rotated relative to the first segment so that sides of their perimeters abut. A third polar segment of the heliostat array has a perimeter 124c also shaped as a trapezoid. The third segment is rotated relative to the second segment so that sides of their perimeters abut. The heliostats 324a of the first segment are grouped in linear rows 424a oriented parallel to the base of the perimeter 124a. Likewise, the heliostats 324b of the second segment are grouped in linear rows 424b parallel to the base of the perimeter 124b, and the heliostats 324c of the third segment are grouped in linear rows 424c parallel to the base of the perimeter 124c. Note that the rows in each polar segment are also oriented perpendicular to a radial line to the receiver, which is an angular axis of symmetry for each trapezoid.

Although the embodiment of FIG. 14 shows only a north field, other embodiments may include a symmetric south field resulting in a hexagonal heliostat array, which may be densely tiled in a power plant. Yet other embodiments may have more or fewer polar segments.

Figure 15:
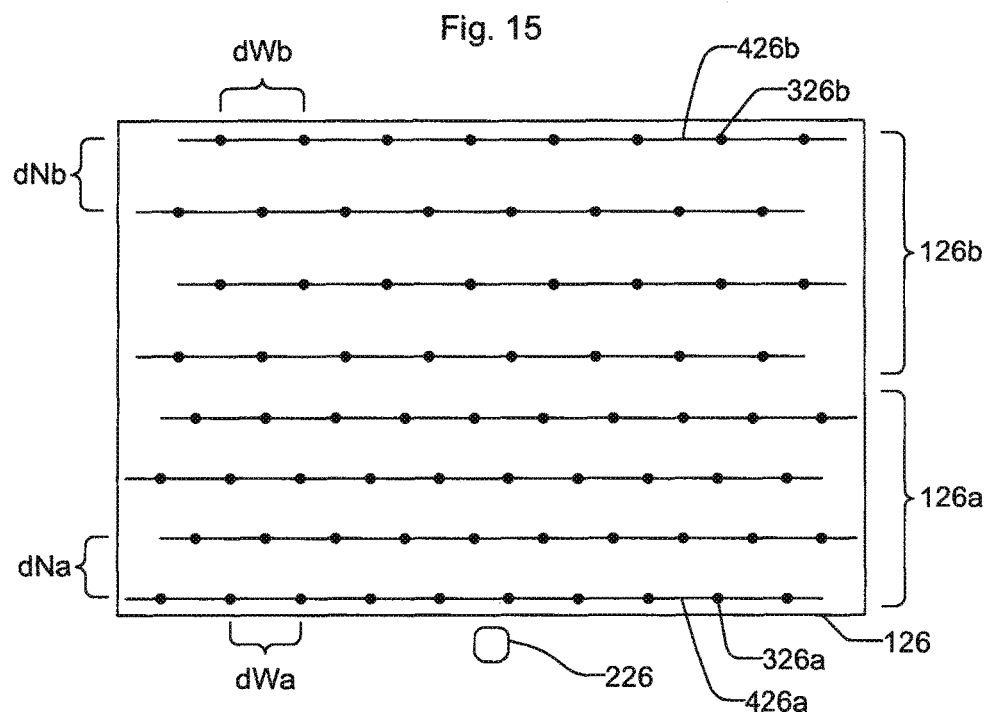

FIG. 15 is a plan view of an embodiment of a CRM suitable for use with a solar power plant, for example, the power plant embodiment of FIG. 1. The module includes a receiver 226 and a north heliostat array having a perimeter 126 with a rectangular shape. Unlike the embodiments shown in the prior figures, the heliostats in the present embodiment are not uniformly spaced throughout. The heliostat array includes a first zone 126a and second zone 126b. The first zone 126a is closer to the receiver 226 than is the second zone 126b. The first zone 126a has heliostats 326a grouped in parallel rows 426a running east-west. The heliostats 326a in the first zone 126a are spaced from neighboring heliostats in the same row by a distance dWa and the rows 426a in the first zone 126a are spaced by a distance dNa. The second zone 126b has heliostats 326b grouped in parallel rows 426b also running east-west. The heliostats 326b in the second zone 126b are spaced from neighboring heliostats in the same row by a distance dWb and the rows 426b in the second zone 126b are spaced by a distance dNb.

The spacing distances dWb, dNb of the second zone are proportionately greater than the spacing distances dWa, dNa of the first zone. The locations of the heliostats are uniformly distributed in each of the zones. That is, for a sufficiently large area, the number of heliostat in the area is the same, independent of the location of the area. However, the number of heliostats in an area of a given size is greater in the first zone 126a than in the second zone 126b. Thus, the mirror-to-land density (the mirror area per unit land area) is greater in the first zone 126a than in the second zone 126b.

In other embodiments, the spacing dNb may be greater than the spacing distance dNa with the spacing distance dWb equal to spacing distance dWa. Greater spacing for in the second zone 126b is intended to reduce shading and blocking. The embodiment of FIG. 15 has two zones of heliostats, but other embodiments may have a greater number of zones. A large number of zones will approximate continuously varying spacing of heliostats, but results in higher part count and installation complexity.

Figure 16:
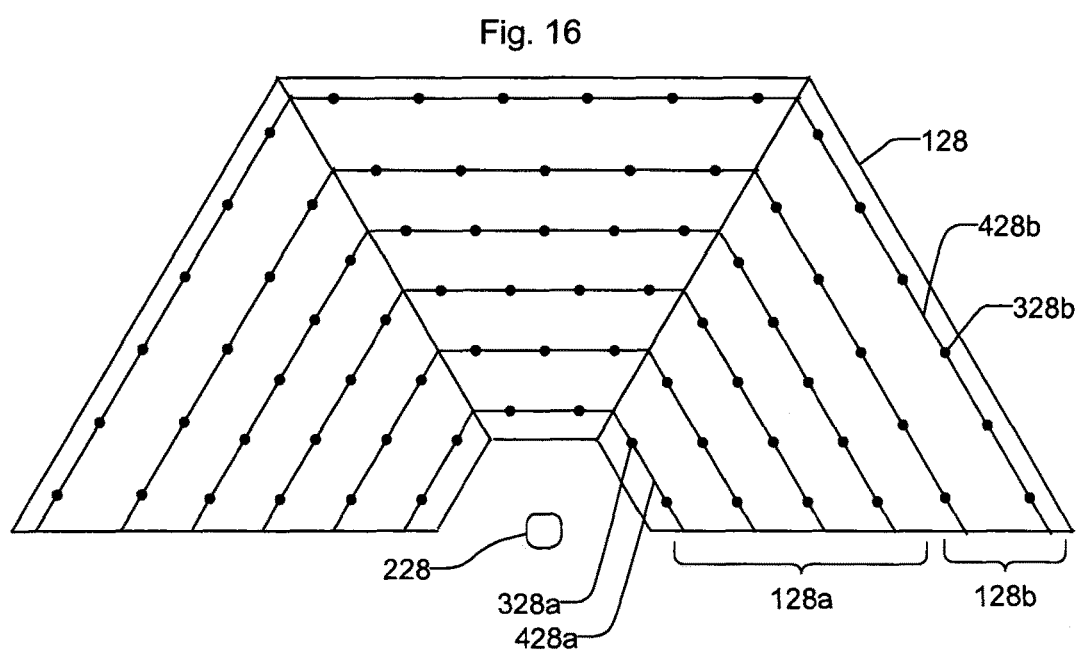

FIG. 16 is a plan view of an embodiment of a CRM combining the polar segment shapes of the embodiment of FIG. 14 with the variably spaced heliostat zones of the embodiment of FIG. 15. The heliostat array has three polar segments 128 arranged like those of the embodiment of FIG. 14. Each segment is divided into two radial zones: a first zone 128a and second zone 128b. The first zone 128a is closer to the tower 200 than is the second zone 128b. Heliostats 328a in the first zone 128a are spaced closer together than are heliostats 328b in the second zone 128b.

Figure 17:
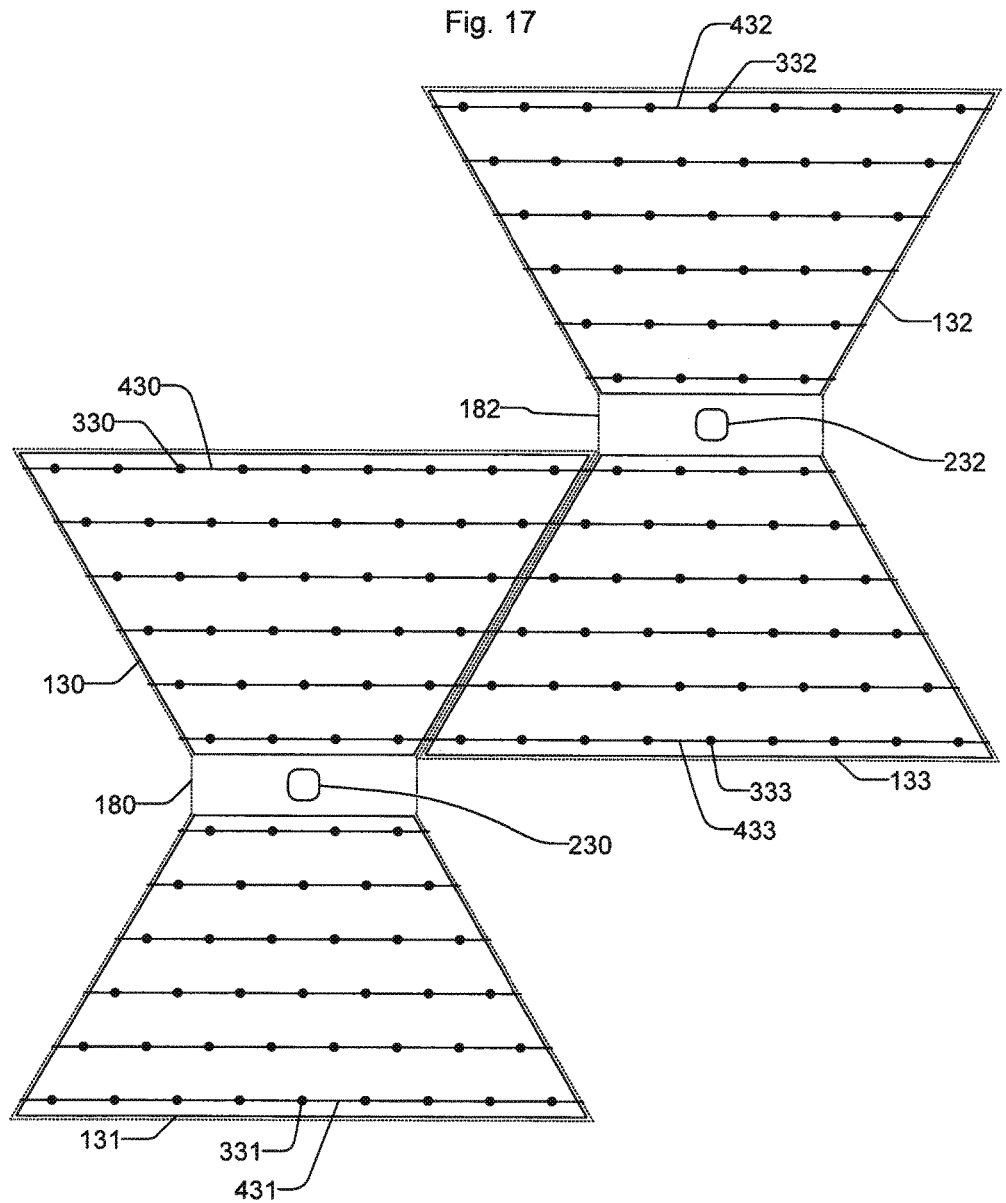
FIGS. 17 and 18 are plan views of adjacent heliostat arrays according to aspects of the present invention.

FIG. 17 is a plan view of an embodiment of two adjacent CRMs suitable for use with a solar power plant, for example, the power plant embodiment of FIG. 3. A first CRM 180 includes a first receiver 230 and a heliostat array split into a first north portion with a trapezoidal perimeter 130 and a first south portion also with a trapezoidal perimeter 131. The heliostats in the first north and south portions 130, 131 are configured to reflect sunlight to the first receiver 230. A second CRM 182 includes a receiver 232 and a heliostat array split into a second north portion with a trapezoidal perimeter 132 and a second south portion also with a trapezoidal perimeter 133. The heliostats in the second north and south portions 132, 133 are configured to reflect sunlight to the second receiver 230. Each portion is essentially similar to the heliostat array of the embodiment of FIG. 8.

The heliostats 330 in the first north portion are grouped in linear rows 430 that extend across both the first north portion and second south portion. That is, heliostats 333 in the second south portion are grouped in rows 433 that are collinear with the rows 430 of the first north portion. Two heliostat arrays are shown in embodiment of FIG. 17; however, in other embodiments, the collinear rows may extend across more heliostat arrays, for example, extending across an entire solar power plant. The rows of heliostats in heliostat arrays configured to reflect sunlight to different receivers, in addition to being collinear, may be mounted on a shared support structure. For example, a linear support member 403 as shown in the embodiment of FIG. 7 may have heliostats mounted on it that belong to different heliostat arrays and thus are configured to reflect sunlight to different receivers.

Figure 18:
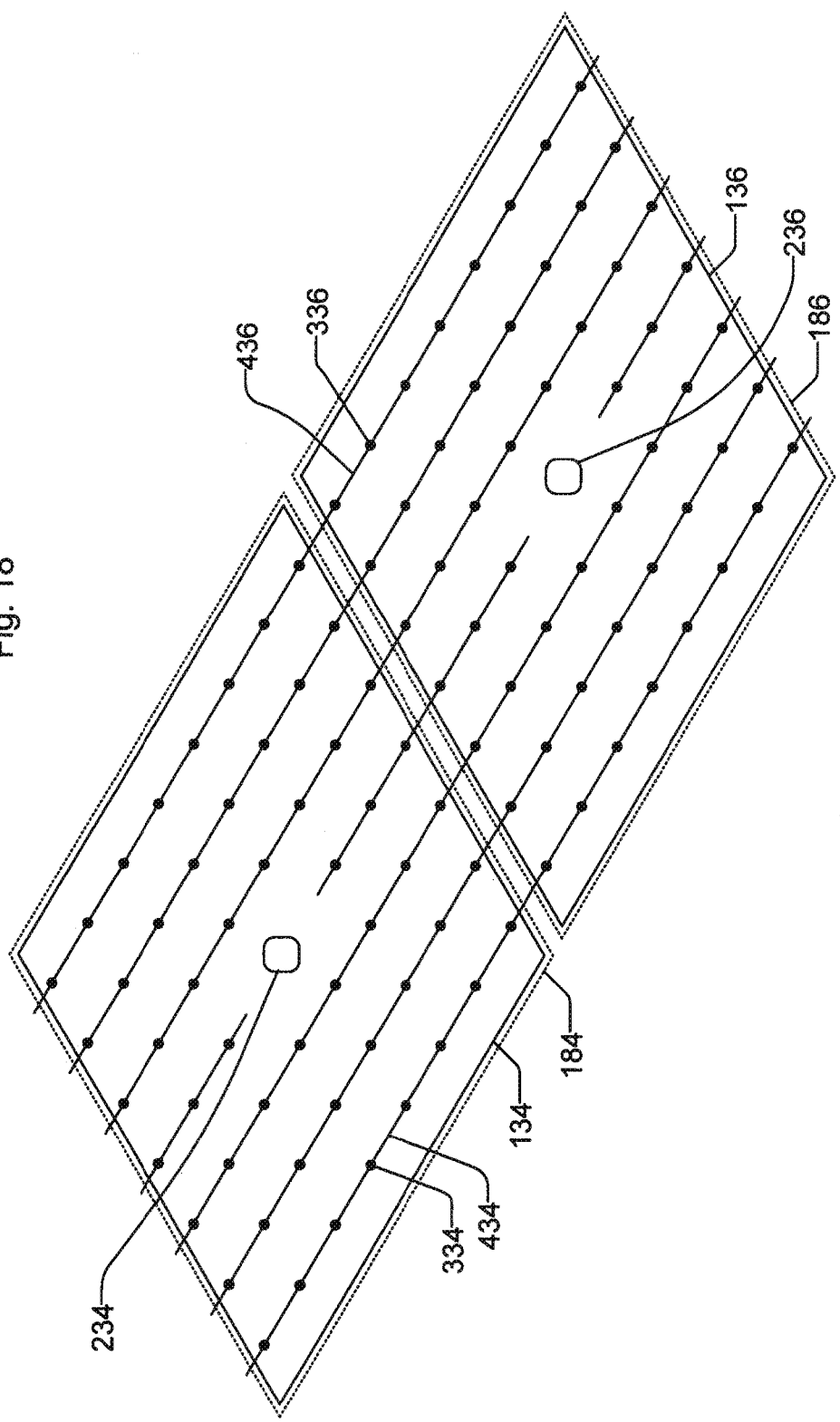

FIG. 18 is a plan view of an embodiment of two adjacent CRMs suitable for use with a solar power plant, for example, the power plant embodiment of FIG. 4. A first CRM 184 includes a first receiver 234 and a first heliostat array having a rhombus shaped perimeter 134. Heliostats 334 in the first CRM 184 are configured to reflect sunlight to the first receiver 234. A second CRM 186 includes a second receiver 236 and a second heliostat array having a rhombus shaped perimeter 136. Heliostats 336 in the second CRM 186 are configured to reflect sunlight to the second receiver 236.

The heliostats 334 in the first CRM 184 are grouped in linear rows 434 that extend across both the first CRM 184 and second CRM 186. That is, heliostats 336 in the second CRM 186 are grouped in rows 436 that are collinear with the rows 434 of the first CRM 184. Two heliostat arrays are shown in embodiment of FIG. 18; however, in other embodiments, the collinear rows may extend across more heliostat arrays, for example, extending across an entire solar power plant. The rows of heliostats in heliostat arrays configured to reflect sunlight to different receivers, in addition to being collinear, may be mounted on a shared support structure. For example, a linear support member 403 as shown in the embodiment of FIG. 7 may have heliostats mounted on it that belong to different heliostat arrays and thus are configured to reflect sunlight to different receivers.

Figure 19:
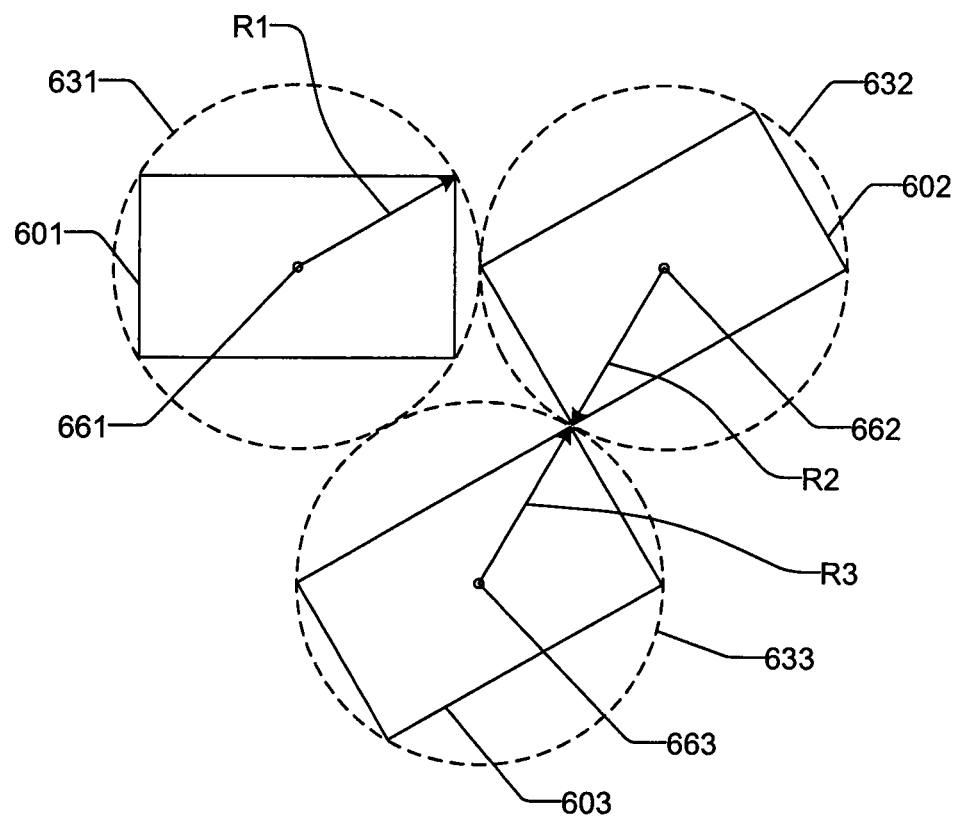
FIG. 19 is a schematic plan view of heliostat mirrors according to aspects of the present invention.

FIG. 19 is a schematic plan view of a neighborhood of three heliostat mirrors according to aspects of the present invention. The neighborhood includes first through third rectangular mirrors 601-603 in a hexagonally-packed arrangement. The mirrors are centered at first through third center points 661-663. When the mirrors are planar and horizontal, the maximum extension of a mirror toward other mirrors occurs at the corners, which when rotated sweeps a circle. For example, the extent of the first mirror 601 is limited to a circumscribing circle 631. The second mirror 602 and the third mirror 603 are oriented in FIG. 19 so their edges are as close as possible to each other. The second mirror 602 is oriented so that a radial vector R2 to a corner of the mirror points toward the third mirror's center 663. Similarly, the third mirror 603 is oriented to that a radial vector R3 to a corner of the mirror points toward the second mirror's center 662. When the lengths of the radial vectors R2, R3 are not greater than half the distance between mirror centers, the mirrors can move without interfering. That is, regardless of the orientations of two adjacent mirrors, they cannot make physical contact.

Circular shaped mirrors have the largest area of any non-interfering mirror shape but may be costly to manufacture. Alternative mirror shapes will now be described with reference to FIGS. 20A-E.

Figure 20A:
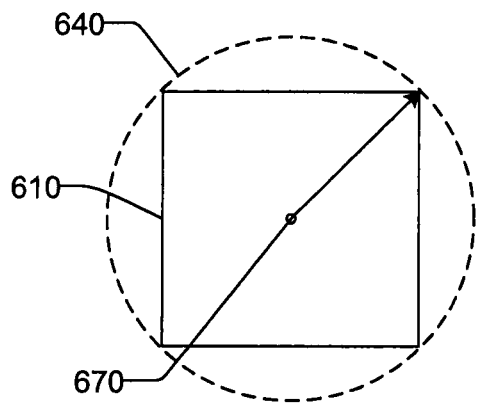
FIGS. 20A-20E are diagrams of heliostat mirrors according to aspects of the present invention.

FIG. 20A shows a mirror 610 with a square perimeter. For size reference, the square mirror 610 is shown circumscribed by a circle 640. The square mirror has an area that is approximately 64% of the area of the circumscribing circle.

Figure 20B:
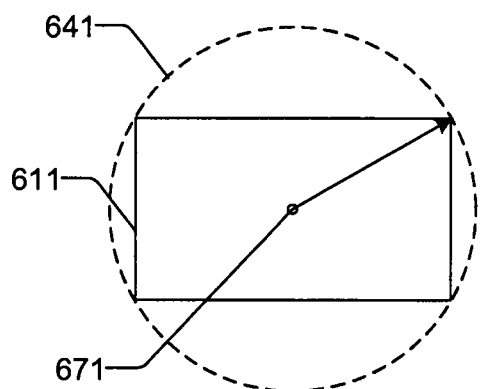

FIG. 20B shows a mirror 611 with a rectangular perimeter. For size reference, the rectangular mirror 611 is shown circumscribed by a circle 641. The rectangular mirror has an aspect ratio of root(3), although the invention is not so limited, and has an area that is approximately 55% of the area of the circumscribing circle. Although the area of the rectangular mirror 611 is smaller than the square mirror 610, it may be preferred in some heliostat array embodiments because of less blocking.

Figure 20C:
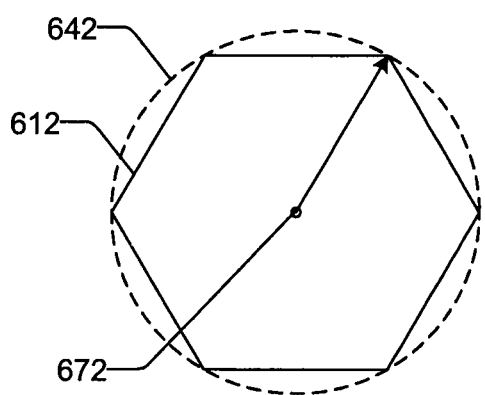

FIG. 20C shows a mirror 612 with a hexagonal perimeter. For size reference, the hexagonal mirror 612 is shown circumscribed by a circle 642. The hexagonal mirror has an area that is approximately 83% of the area of the circumscribing circle.

Figure 20D:
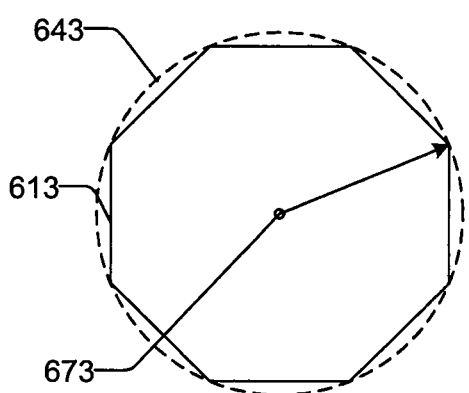

FIG. 20D shows a mirror 613 with an octagonal perimeter. For size reference, the octagonal mirror 613 is shown circumscribed by a circle 643. The octagonal mirror has an area that is approximately 90% of the area of the circumscribing circle.

Figure 20E:
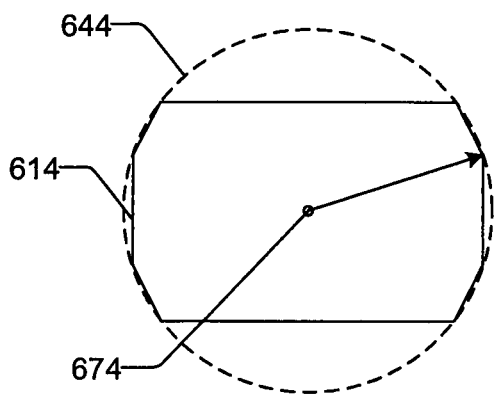

FIG. 20E shows a mirror 614 with a rectangular perimeter with clipped corners (irregular octagon). For size reference, the clipped-rectangular mirror 614 is shown circumscribed by a circle with a radius R. The clipped-rectangle has an area that is approximately 70% of the area of the circumscribing circle.

Figure 21:
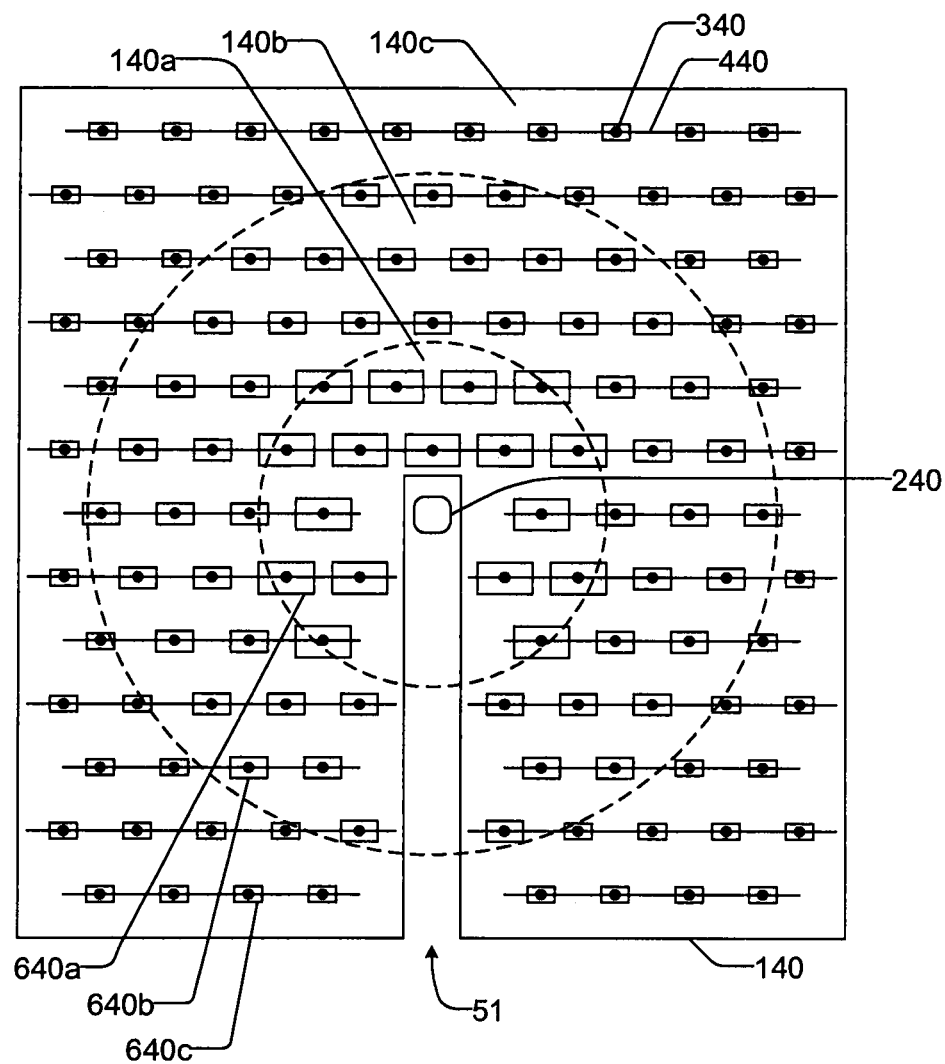
FIGS. 21 and 22 are plan views of heliostat arrays according to embodiments of the present invention.

FIG. 21 is a plan view of an embodiment of a CRM suitable for use with a solar power plant, for example, the power plant of FIG. 2. The CRM includes a receiver 240 centrally located in a rectangular heliostat array having a perimeter 140 with a U-shape similar to the embodiment of FIG. 11. The heliostats 340 are grouped in linear rows 440 oriented in an east-west direction. The heliostats 340 are uniformly spaced throughout the heliostat array except no heliostats are located in an access lane 51. Unlike previously described heliostat arrays, the heliostats in the present embodiment do not have identical mirrors.

The heliostat array has a first zone 140a, a second zone 140b, and a third zone 140c. The first zone 140a extends from the receiver 240 to a circle concentric with the receiver 240. The second zone 140b extends from the distal edge of the first zone 140a to another circle concentric with the receiver 240. The third zone 140c extends from the distal edge of the second zone 140b to perimeter 140 of the heliostat array. Heliostats located in the first zone 140a have mirrors 640a. Heliostats located in the second zone 140b have mirrors 640b with smaller areas than the mirrors 640a of heliostats located in the first zone 140a. Likewise, heliostats located in the third zone 140c have mirrors 640c with smaller areas than the mirrors 640b of heliostats located in the second zone 140b.

Although the locations of the heliostats area uniformly distributed throughout the zones, due to the differing mirror areas between zones, the mirror-to-land density differs between zones. Specifically, since the mirrors 640a in the first zone 140a have larger areas than the mirrors 640b in the second zone 140b, the mirror-to-land density in the first zone 140a is greater than the mirror-to-land density in the second zone 140b. Likewise, since the mirrors 640b in the second zone 140b have larger areas than the mirrors 640c in the third zone 140c, the mirror-to-land density in the second zone 140b is greater than the mirror-to-land density in the third zone 140c.

In some embodiments, the mirrors of the different zones have the same geometric shape but with different scales. In other embodiments, the mirrors of the different zones have the same radius but different shapes. For example, the mirrors in the first zone may be octagonal, the mirrors in the second zone may be square, and the mirrors in the third zone may be rectangular. Larger mirror areas close to the receiver are effective at filling the available area and smaller mirrors more distant from the receiver avoid blocking while reducing cost.

Figure 22:
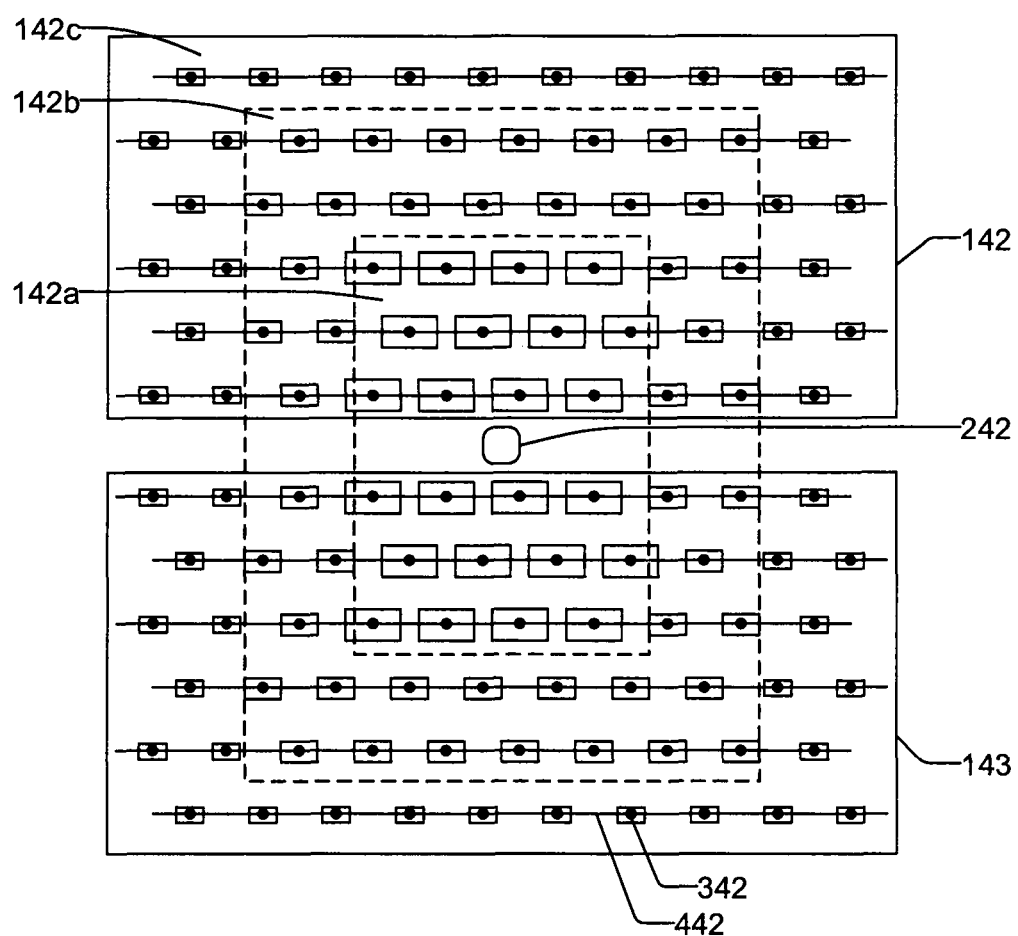

FIG. 22 is a plan view of an embodiment of a CRM suitable for use with a solar power plant, for example, a power plant of the embodiment of FIG. 1. Like the embodiment of FIG. 10, the present embodiment includes a receiver 242, a heliostat array north portion with a rectangular perimeter 142, and a heliostat array south portion also with a rectangular perimeter 143. The heliostats 342 are grouped in linear rows 442. The heliostats are uniformly distributed in each portion.

Similar to the embodiment of FIG. 21, the heliostat array has a first zone 142a, a second zone 142b, and a third zone 142c. The first zone 142a extends from the receiver 242 to a rectangle concentric with the receiver 242. The second zone 142b extends from the outer edge of the first zone 142a to another rectangle concentric with the receiver 242. The third zone 140c extends from the outer edge of the second zone 142b to the perimeters 142, 143 of the heliostat array. Mirrors of heliostats located in the first zone 142a have larger areas than mirrors of heliostats located in the second zone 142b. Likewise, mirrors of heliostats located in the second zone 142b have larger areas than mirrors of heliostats located in the third zone 142c. In some embodiments, the mirrors of the different zones have the same geometric shape but with different scales. In other embodiments, the mirrors of the different zones have the same radius but different shapes. By using rectangular zones, installation of the heliostats is simplified. In other embodiments, the boundaries between zones may have other polygonal shapes, for example, hexagonal.

Although the present invention has been described in certain specific embodiments, many additional modifications and variations would be apparent to those skilled in the art. It is therefore to be understood that this invention may be practiced other than as specifically described. Thus, the present embodiments of the invention should be considered in all respects as illustrative and not restrictive and the scope of the invention determined by the claims supported by this application and their equivalents.

What is claimed is:

1. A solar power plant, comprising:
   at least one solar receiver; and
   a heliostat array comprising a plurality of linear support structures and a plurality of heliostats, the plurality of heliostats mounted to the plurality of linear support structures and grouped in linear rows, each of the linear support structures being parallel to another of the linear support structures, and each heliostat comprising a mirror for reflecting sunlight to the at least one solar receiver, wherein the heliostat array is divided into a plurality of zones, the mirrors within each zone having at least one of: substantially the same geometry and substantially the same spacing, and the mirrors of different zones having at least one of: different geometries and different spacing, wherein each zone comprises a portion of the plurality of linear support structures, and wherein the linear support structures of each zone are separated by the same distance and the linear support structures of different zones are separated by different distances.

2. The solar power plant of claim 1 further comprising:
   a tower, wherein the at least one solar receiver is attached to the tower.

3. The solar power plant of claim 1, wherein at least two of the plurality of heliostats are mounted to a corresponding linear support structure of the plurality of linear support structures.

4. The solar power plant of claim 1, wherein each zone includes heliostats of at least two of the linear rows.

5. The solar power plant of claim 1, wherein the heliostat array is configured as a set of rows and columns.

6. The solar power plant of claim 1, further comprising:
   a power block, wherein the power block receives power from the at least one solar receiver.

7. The solar power plant of claim 1, wherein the plurality of heliostats of the heliostat array further comprise:
   a first portion of the plurality of heliostats located north of the at least one solar receiver, wherein the first portion has a quadrilateral perimeter.

8. The solar power plant of claim 7, wherein the plurality of heliostats of the heliostat array further comprise:
   a second portion of the plurality of heliostats located south of the at least one solar receiver, wherein the second portion has a quadrilateral perimeter.

9. The solar power plant of claim 1, wherein at least two of the heliostat mirrors have different areas.

10. The solar power plant of claim 1, wherein at least one of the linear support structures is shared between the heliostat array and a second heliostat array of the solar power plant adjacent to the heliostat array, the second heliostat array comprising a plurality of heliostats, each heliostat comprising a mirror for reflecting sunlight to a second solar receiver.

11. The solar power plant of claim 1, wherein the solar receiver is at least one of: photovoltaic, thermal, and thermochemical.

12. The solar power plant of claim 1, wherein the mirrors of at least two of the plurality of heliostats have different polygonal shapes.

13. The solar power plant of claim 1, wherein the zones are closed polygons containing a base of the tower.

14. The solar power plant of claim 1, wherein the distance between adjacent linear support structures of a heliostat array is smaller in a zone closer to the tower than in a zone farther from the tower.

15. A solar power plant, comprising:
    at least one solar receiver; and
    a heliostat array comprising a plurality of linear support structures and a plurality of heliostats, the plurality of heliostats mounted to the plurality of linear support structures and grouped in linear rows, each of the linear support structures being parallel to another of the linear support structures, and each heliostat comprising a mirror for reflecting sunlight to the at least one solar receiver, wherein the heliostat array is divided into a plurality of zones, the mirrors within each zone having at least one of: substantially the same geometry and substantially the same spacing, and the mirrors of different zones having at least one of: different geometries and different spacing, wherein the heliostat array comprises a plurality of polar sectors, each sector having rows aligned perpendicular to an axis of symmetry of the sector, wherein each of the polar sectors is divided into the plurality of zones, wherein the distance between adjacent linear support structures of the heliostat array is smaller in a zone closer to the tower than in a zone farther from the tower.

16. The solar power plant of claim 15 further comprising:
    a tower, wherein the at least one solar receiver is attached to the tower.

17. The solar power plant of claim 15, wherein at least two of the plurality of heliostats are mounted to a corresponding linear support structure of the plurality of linear support structures.

18. The solar power plant of claim 15, further comprising:
    a power block, wherein the power block receives power from the at least one solar receiver.

19. The solar power plant of claim 15, wherein at least two of the heliostat mirrors have different areas.

20. The solar power plant of claim 15, wherein the mirrors of at least two of the plurality of heliostats have different polygonal shapes.

* * * * *